United States Patent [19]
Baker

[11] Patent Number: 5,789,928
[45] Date of Patent: Aug. 4, 1998

[54] CIRCUIT AND METHOD FOR DISCRIMINATING THE SOURCE OF WAVEFORM DISTORTION IN AN ELECTRIC POWER GENERATION AND DISTRIBUTION SYSTEM

[75] Inventor: Roy S. Baker, Rockford, Ill.

[73] Assignee: Sundstrand Corporation, Rockford, Ill.

[21] Appl. No.: 551,389

[22] Filed: Nov. 1, 1995

[51] Int. Cl.⁶ .......................... G01R 21/06; G01R 23/20; H02P 13/30
[52] U.S. Cl. ...................... 324/623; 324/76.31; 324/522; 324/620; 307/105; 361/79
[58] Field of Search .................... 324/620, 623, 324/509, 522, 771, 86, 76.31; 361/79, 86, 115; 322/20, 29; 307/105

[56] References Cited

U.S. PATENT DOCUMENTS

| | | | |
|---|---|---|---|
| 3,753,089 | 8/1973 | Gunn et al. | 324/522 X |
| 4,340,854 | 7/1982 | Jones et al. | 324/623 |
| 4,607,309 | 8/1986 | Bishop | 324/86 X |
| 4,812,669 | 3/1989 | Takeda et al. | 307/105 |
| 4,818,947 | 4/1989 | Zucker et al. | 324/623 |
| 4,918,381 | 4/1990 | Bender et al. | 324/76.21 |
| 5,072,187 | 12/1991 | Shilo | 324/623 |
| 5,170,114 | 12/1992 | Lowenstein et al. | 324/623 |
| 5,256,976 | 10/1993 | Ishikawa et al. | 324/522 |
| 5,347,464 | 9/1994 | McEachern et al. | 364/483 |
| 5,406,189 | 4/1995 | Wohlberg et al. | 322/10 |
| 5,487,016 | 1/1996 | Elms | 324/623 |

*Primary Examiner*—Vinh P. Nguyen
*Assistant Examiner*—Diep Do
*Attorney, Agent, or Firm*—Jeffery J. Makeever

[57] ABSTRACT

A circuit to discriminate the source of harmonic distortion of the output voltage comprises voltage sensors coupled to the output terminals of a source of electric power and to a point of regulation remote from the source for sensing the output voltage waveform present at each of these locations. The circuit then utilizes these two sensed waveforms to discriminate the source of any harmonic distortion between the source of electric power and the utlization equipment. This circuit calculates the percentage total harmonic content of each of the sensed waveforms, and compares them to determine the source of distortion. If the percentage total harmonic content sensed at the point of regulation is greater than that sensed at the terminals of the source of electric power, the source of distortion is discriminated to be the utilization equipment; otherwise, the source of distortion is identified to be the source of electric power. The circuit also calculates the actual voltage difference between the two sensed voltages, and senses the current flowing in the feeders which is compared with a profile of the normal voltage drop versus connected load to generate an expected voltage drop. The two voltage difference signals are then compared. The circuit indicates the source of the harmonic distortion as the utilization equipment when the actual voltage difference deviates from the expected drop by greater than a predetermined amount.

15 Claims, 3 Drawing Sheets

CIRCUIT AND METHOD FOR DISCRIMINATING THE SOURCE OF WAVEFORM DISTORTION IN AN ELECTRIC POWER GENERATION AND DISTRIBUTION SYSTEM

FIELD OF THE INVENTION

The instant invention relates generally to waveform distortion discrimination, and more particularly to a system for determining the source of waveform distortion in an electric power generation and distribution system.

BACKGROUND ART

The output of electric power generation and distribution systems for use on aircraft are governed by various power quality specifications to ensure that the power being delivered to the utilization equipment is of sufficient quality so as to not damage or stress this equipment. These specifications or others also define how the system is to react in the event of a failure of the power regulation system resulting in abnormal quality being supplied to the distribution buses. With a conventional constant speed generator based electric power generation system, the types of abnormal power which may be expected from the possible failure modes are limited mainly to over and under voltage type failures.

With the advent of static source based electric power generation systems, such as variable speed constant frequency (VSCF) systems as illustrated in FIG. 1, the types of abnormal power which may be generated due to a failure within the power regulation control are much more numerous. For example, in addition to over and under voltage conditions, a VSCF system must protect against abnormal phase relationship between output phases, dc content in the output waveforms, and total harmonic distortion of the output waveform to name a few. When one of these conditions is sensed, the electronic power converter is typically shut down and the utilization equipment is switched to another source of electric power. Such action, since it entails the loss of an entire source of electric power generation, is to be taken without only when it is absolutely necessary to isolate the fault.

Most modern aircraft, in addition to the standard equipment which has been carried for years, are being equipped with utilization equipment which is increasingly more sophisticated, including flight control computers, radar systems, electronic actuation systems, personal entertainment systems, et cetera. Although the electric power generation system can adequately supply the amount of additional power required by these newly included loads, a larger and larger proportion of the total amount of equipment on the aircraft exhibits nonlinear characteristics which can increase the distortion on the distribution buses. Since the source of this increased distortion could be from a failed control of the VSCF power converter, the electric power generation system controller, having detected this increased distortion, will trip the converter off line under the rules of its protection logic. While this is the proper action when the increased distortion is the result of a failed control for the converter, it is improper when the source of the distortion is a large non-linear load. In addition to improperly de-energizing the particular bus supplied by the converter, the maintenance action indicated by the controller will be improper since it will identify the converter as failed, instead of identifying the proper source of the high harmonic content of the waveform.

Prior systems for detecting the total harmonic content of a waveform are adequate for their limited purpose of discerning the percentage of the total harmonic distortion present in the waveform itself at a point of regulation. However, none of these systems are capable, in an electric power generation and distribution system, of discriminating between harmonic distortion resulting from a non-linear load and harmonic distortion resulting from a failed power converter. Without such discrimination capability, improper de-energization of a nonfaulted power converter may occur with an accompanying loss of generation capability for the system. In such a situation maintenance personnel may likely remove the converter from the aircraft and return it to the lab for diagnostic testing. This may drive up the cost of ownership of such a system due to the unnecessary removals based on the lack of discrimination capability of the source of the high harmonic content of the waveform.

The instant invention is directed at overcoming these and other problems present in the art. Accordingly, it is an objective of the invention to provide a system which can detect the percentage total harmonic content of a waveform and provide an input to a system of protection only when the source of such distortion is the power converter. It is another object of the invention to provide a system which can discriminate the source of harmonic distortion along a distribution bus. Further, it is an object of the instant invention to reduce total cost of ownership of a VSCF system by reducing the amount of unscheduled removals of the power converter. Additionally, it is an object of the instant invention to increase the fault isolation capability and overall operating reliability of a VSCF electric power generation system.

SUMMARY OF THE INVENTION

In a preferred embodiment of the instant invention, a discrimination circuit for use in an electric power generation system having a source of electric power producing an output voltage waveform, the source having output terminals coupled by feeders to a point of regulation remote from the source and in relative proximity to a load distribution bus having utilization equipment coupled thereto, the output voltage waveform including harmonic distortion, a source of which is unknown, is disclosed. The discrimination circuit comprises a circuit coupled to the output terminals of the source of electric power for sensing the output voltage waveform present thereon which produces a first voltage sense signal. The discrimination circuit also comprises another circuit coupled to the point of regulation for sensing the output voltage waveform present thereon which produces a second voltage sense signal. Another functional circuit is included which is responsive to both of these voltage sense signals which allows discriminating the source of any harmonic distortion of the output voltage waveform between the source of electric power and the utilization equipment.

This other functional circuit, in a preferred embodiment, comprises a functional circuit which calculates a percentage total harmonic content of the first voltage sense signal representing a percentage total harmonic content present at the output terminals of the source of electric power. Another functional circuit calculates a second percentage total harmonic content of the second voltage sense signal representing a percentage total harmonic content present at the point of regulation. These two percentages are compared in this preferred embodiment. The discrimination circuit indicates the source of the harmonic distortion as the utilization equipment when the second percentage total harmonic content (sensed at the point of regulation) is greater than the first percentage total harmonic content (sensed at the terminals of the source of electric power). This circuit will indicate the source of the harmonic distortion as the source of electric power when the second percentage total harmonic content is not greater than the first percentage total harmonic content.

In a further preferred embodiment, the other functional circuit comprises a circuit to calculate a difference between the voltage signals sensed at the terminals of the source of electric power and at the point of regulation. This circuit produces an actual delta voltage signal. In addition, a circuit is senseably coupled to the feeders for sensing the current flowing therein. This circuit provides a signal representing the connected load of the system. A memory circuit then compares this information with a stored profile of the normal voltage drop versus connected load. The output of this memory circuit is an expected delta voltage signal corresponding to the actual sensed connected load. A comparison circuit then compares this expected delta voltage signal with the actual delta voltage signal calculated above. This circuit indicates the source of the harmonic distortion as the utilization equipment when the actual delta voltage signal deviates from the expected delta voltage signal by an amount greater than a predetermined acceptable amount. If there is not a deviation in the expected voltage drop from the terminals of the source of electric power to the point of regulation, then the source of the harmonic distortion is determined to be the source of electric power.

As used in a protection system to protect the utilization equipment from excessive harmonic distortion resulting from a failed power source, the discrimination circuit allows for an adjustment of the trip threshold when it has discriminated that the source of the harmonic distortion is the utilization equipment and not the power source. In this way, the good power source is not tripped off-line due to harmonics generated by a non-linear load, unless those harmonics become excessive.

A preferred method to discriminate the source of harmonic distortion comprises the steps of sensing the output voltage waveform present at the output terminals of the source of electric power and at the point of regulation; calculating the percentage total harmonic content of the voltage waveform present at both of these locations; and comparing these two percentages of total harmonic content. This last step indicates the source of the harmonic distortion as the utilization equipment when the percentage total harmonic content sensed at the point of regulation is greater than the percentage total harmonic content sensed at the terminals, and indicating that the source of the harmonic distortion is the source of electric power when the percentage total harmonic content sensed at the point of regulation is not greater than the percentage total harmonic content sensed at the terminals.

Alternatively, a preferred method to discriminate the source of harmonic distortion comprises the steps of sensing the output voltage waveform present at the output terminals of the source of electric power and at the point of regulation; calculating a difference between these two output voltage waveforms to produce an actual delta voltage signal; sensing the current flowing in the feeders to produce a connected load signal; comparing this connected load signal with a profile of a normal voltage drop versus connected load to produce an expected delta voltage signal; and comparing the actual delta voltage signal against the expected delta voltage signal. This last step indicates the source of the harmonic distortion as the utilization equipment when the actual delta voltage signal deviates from the expected delta voltage signal by an amount greater than a predetermined amount.

BRIEF DESCRIPTION OF THE DRAWINGS

While the specification concludes with claims particularly pointing out and distinctly claiming that which is regarded as the present invention, the organization, the advantages, and further objects of the invention may be readily ascertained by one skilled in the art from the following detailed description when read in conjunction with the accompanying drawings in which:

DESCRIPTION OF THE PREFERRED EMBODIMENTS

Figure 1:
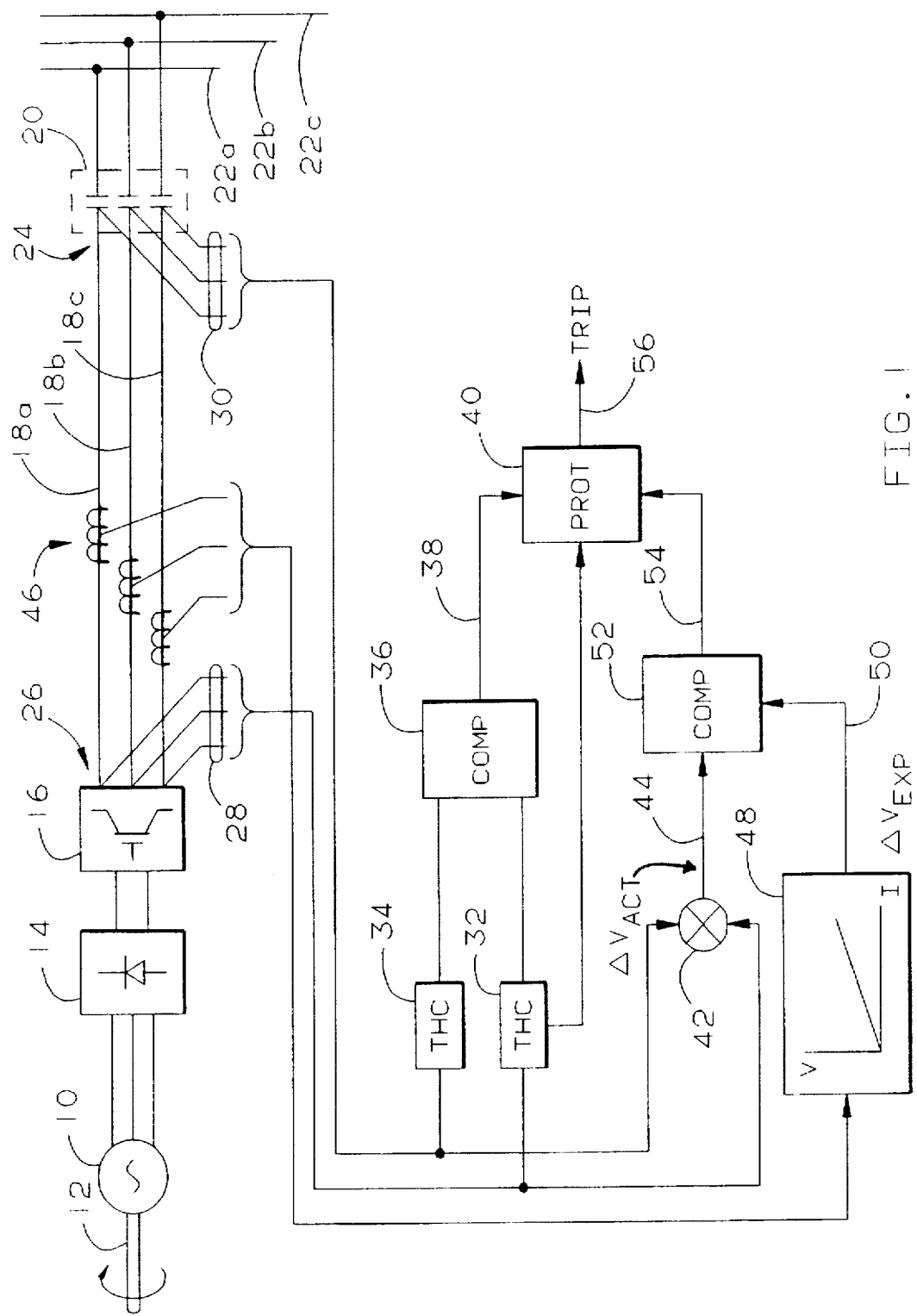
FIG. 1 illustrates a single line schematic block diagram of an embodiment of the instant invention.

An electric power generating system to which the invention is particularly well suited, as illustrated in FIG. 1, comprises a generator 10 which is driven from an engine (not shown) by shaft 12 to produce an electrical output. For a variable speed constant frequency (VSCF) system, this electrical output is coupled to a rectifier 14 which transforms the ac generator output to dc. This dc voltage is coupled to a power converter 16 which electronically produces the output voltage waveform to supply the system loads. This electronically produced output waveform is coupled by feeders 18a, 18b, and 18c to a generator contactor which switchable couples the output power to the load distribution bus 22a, 22b, 22c from which the utilization equipment (not shown) is powered. This generator contactor 20 is in close proximity to the load distribution bus 22a, 22b, 22c, and therefore defines the point of regulation 24. This point of regulation 24 is used by the power generation controller (not shown) to regulate the output voltage magnitude to ensure that the utilization equipment receives voltage within power quality limits. This point 24 is used because the feeder length from the converter 16 to the loads may be quite substantial, and the voltage drop from the terminals 26 of the converter 16 to the distribution bus 22 may be in the range of 5 volts at rated load.

The discrimination circuit of the instant invention comprises sensing means 28 coupled to the output terminals 26 of the converter 16 for sensing the voltage generated thereby. The circuit also includes sensing means 30 coupled to the point of regulation 24 for sensing the voltage at that location. These sensors 28, 30 are input to circuit means 32 and 34 for calculating the percentage total harmonic content (THC) contained in the waveform sensed at each point. These circuit means may be of conventional construction as known in the art. The output of each of these circuits 32, 34 are input to a discriminating comparator circuit means 36 which may be constructed in hardware or software as desired. The output 38 of this comparator 36 is input to protection logic circuitry 40 which protects against the generation of excessive harmonic distortion sensed by circuit 32.

The raw output waveforms from sensors 28 and 30 are also summed by circuit means 42 to calculate an actual delta voltage signal on line 44. The current flowing in the feeders 18 is sensed by conventional means 46, such as current transformers or the like, to determine the load connected to the system. This sensed current is used by memory means 48, which contains a normal voltage drop versus connected load profile, to determine an expected delta voltage signal on line 50. The actual 44 and expected 50 delta voltage signals are compared by a discriminating comparator circuit 52. The output 54 of this comparator 52 is then input to protection logic circuitry 40. The output 56 of this protection circuitry 40 is used by the power generation controller (not shown) to de-energize the generator 10 and trip the generator contactor 20.

During normal operation, the converter 16 produces a sinusoidal ac output with very low total harmonic content. However, even with a "clean" waveform being supplied to the distribution bus 22, the presence of certain non-linear loads can introduce harmonic distortion onto the bus 22. This distortion is sensed by the protection circuitry 40 (by sensors 28 and THC circuit 32), and may result in a converter 16 which is operating correctly to be tripped off line if the distortion exceeds predetermined limits. To preclude such an occurrence, sensors 30 are used in conjunction with sensors 28 to discriminate the source of the distortion. If the source is the converter 16 which is no longer working within specification, the protection circuit 40 is allowed to trip the source (generator 10, rectifier 14, and converter 16) off line and open the contactor 20. If, however, the source of the distortion is discriminated to the utilization equipment, the protection circuit 40 either is precluded from tripping the source off line, or at least biases up its trip threshold.

Figure 2:
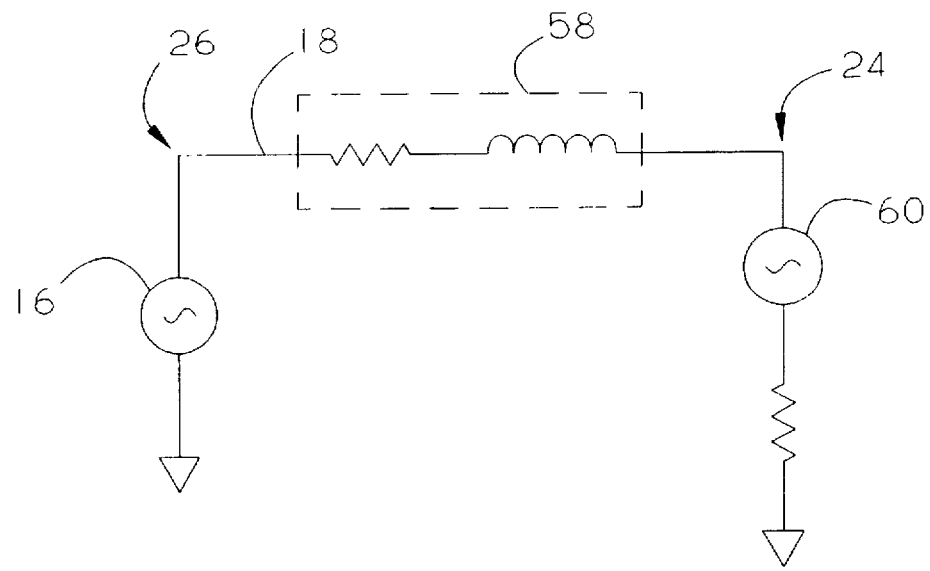
FIG. 2 illustrates an equivalent circuit of an electric power system wherein harmonic distortion is being generated by utilization equipment.

In a preferred embodiment of the instant invention, this discrimination is accomplished by comparing the THC sensed at the terminals 26 of the converter 16 with that sensed at the point of regulation 24. Because the feeders 18a, 18b, 18c have a given impedance 58 associated therewith (see FIG. 2), distortion generated by the utilization equipment (represented by a source of distortion 60) will be greater at the point or regulation 24 than at the terminals 26 of the converter 16 due to the associated voltage drop going from the point of regulation 24 to the terminals 26. The output waveform of the converter 16, however, will have an associated voltage drop from the terminals 26 to the point of regulation 24. Knowing these facts, the comparator 36 can discriminate the source of distortion as the utilization equipment on line 38 when the THC sensed by circuit 34 is greater than that sensed by circuit 32.

Figure 3:
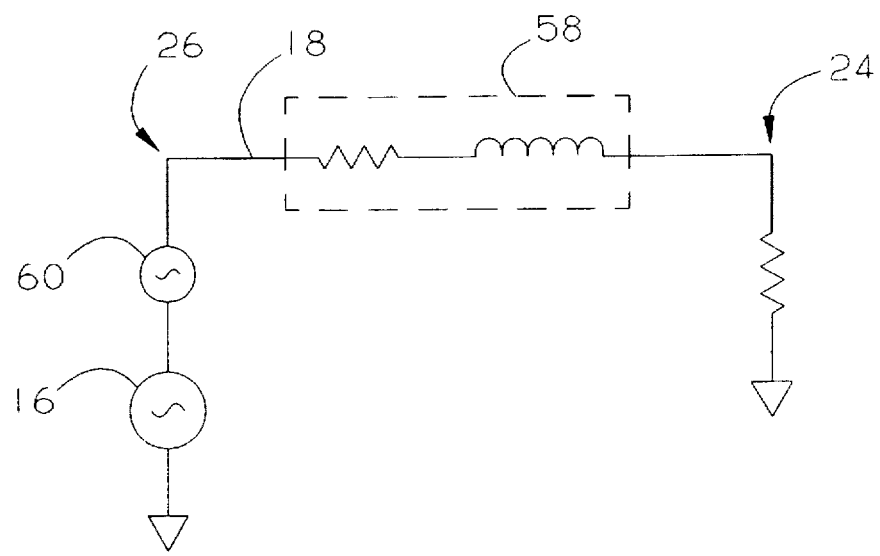
FIG. 3 illustrates an equivalent circuit of an electric power system wherein harmonic distortion is being generated by the source of electric power.

If, however, the source of distortion 60 is because of the converter 16 (see FIG. 3), both the output waveform of the converter 16 and the distortion will experience a voltage drop from the terminals 26 to the point of regulation 24. In this situation, the THC sensed at the point of regulation 24 will not be greater than that sensed at the terminals 26, and may actually be equal. Knowing this, the comparator 36 can discriminate the source of distortion as the converter 16, and allow the protection circuit 40 to trip the source off line in a normal manner.

Figure 4:
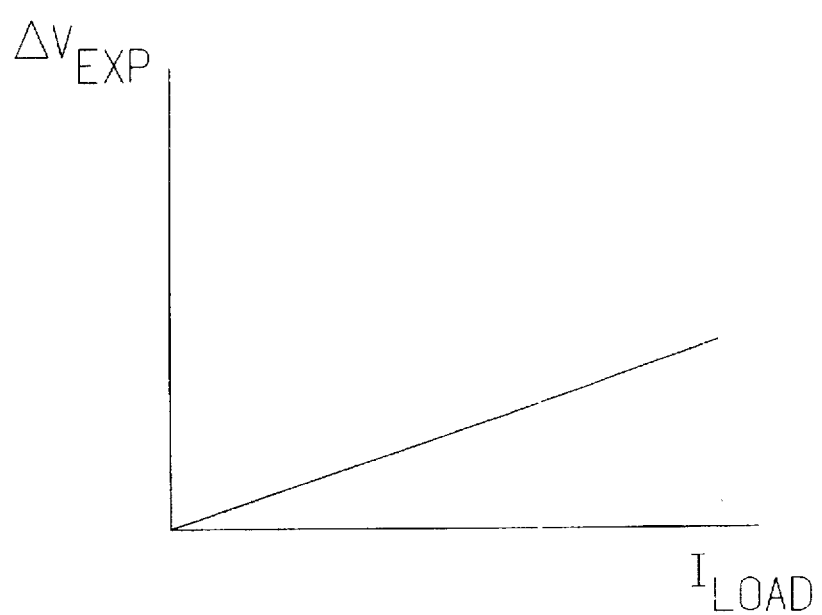
FIG. 4 illustrates a profile of a normal voltage drop versus connected load applicable to an embodiment of the instant invention.

Although the harmonic currents produced by the source of distortion 60 when located on the distribution bus 22 (see FIG. 2) will produce a voltage drop between the point of regulation 24 and the terminals 26, this voltage drop may actually add to or subtract from the voltage drop of the output of the converter 16. Whether these voltage drops add or subtract is dependent on the frequency of the load induced harmonic currents and their relationship to the converter output waveform frequency. Since the feeder impedance 58 is known or can be calculated, a predetermined normal voltage drop versus connected load profile (see FIG. 4) can be developed and stored in memory 48. This profile can preferably be developed in a lab environment using balanced loads, or may be calculated.

To discriminate the source of distortion, the actual voltages sensed at the terminals 26 and the point of regulation 24 are subtracted to determine the actual voltage drop between these two points. The current is then sensed 46 and used by the memory circuit 48 to determine what the expected voltage drop should be between these two points assuming no load induced harmonic distortion. These two values are then compared 52, and if a deviation of greater than a predetermined acceptable amount is detected, the distortion is most probably load induced.

In a highly preferred embodiment, both methods of discriminating the source of harmonic distortion are used, although it is recognized that either alone may well suit the design. It is the intent of the harmonic protection to prevent a supposedly deteriorating converter 16 power supply from providing a distorted output to the utilization equipment. Should the threshold level of distortion be reached and either comparator 36 or 52, or both indicate that the distortion is load induced, the threshold could be biased upwards by an amount proportionately equal to the amount of load induced distortion. Alternatively, the threshold may be biased up by a fixed amount so as to not allow the total distortion to exceed a maximum amount, regardless of its source.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved. For example, although a VSCF system has been described hereinabove, this discrimination circuit and method may be suited to constant speed generator systems as well, and the environment should not be seen to limit the invention.

I claim:

1. A discrimination circuit for use in an electric power generation system having a source of electric power producing an output voltage waveform, the source having output terminals coupled by feeders to a point of regulation remote from the source and in relative proximity to a load distribution bus having utilization equipment coupled thereto, the output voltage waveform including harmonic distortion, a source of which is unknown, the circuit comprising:

first means coupled to the output terminals of the source of electric power for sensing the output voltage waveform present thereon, said first means producing a first voltage sense signal in response thereto;

second means coupled to the point of regulation for sensing the output voltage waveform present thereon, said second means producing a second voltage sense signal in response thereto; and third means responsive to said first and said second voltage sense signals for discriminating a source of any harmonic distortion of the output voltage waveform between the source of electric power and the utilization equipment.

2. A discrimination circuit for use in an electric powered generation system having a source of electric power producing an output voltage waveform, the source having output terminals coulpled by feeders to a point of regulation remote from the source and in relative proximity to a load distribution bus having utilization equipment coupled thereto, the output voltage waveform including harmonic distortion, a source of which is unknown, the circuit comprising:

first means coupled to the output terminals of the source of electric power for sensing the output voltage waveform present thereon, said first means producing a first voltage sense signal in response thereto;

second means coupled to the point of regulation for sensing the output voltage waveform present thereon, said second means producing a second voltage sense signal in response thereto;

third means responsive to said first and said second voltage sense signals for discriminating a source of any harmonic distortion of the output voltage waveform between the source of electric power and the utilization equipment; and wherein said third means comprises, fourth means coupled to said first means for calculating a first percentage total harmonic content of said first voltage sense signal representing a percentage total harmonic content present at the output terminals of the source of electric power, fifth means coupled to said second means for calculating a second percentage total harmonic content of said second voltage sense signal representing a percentage total harmonic content present at the point of regulation, and sixth means coupled to said fourth and said fifth means for comparing said first percentage total harmonic content with said second percentage total harmonic content, said sixth means indicating the source of the harmonic distortion as utilization equipment when said second percentage total harmonic content is greater than said first percentage total harmonic content, said sixth means further indicating the source of harmonic distortion as the source of electric power when said second percentage total harmonic content is not greater than said first percentage total harmonic content.

3. The circuit of claim 2, wherein said third means further comprises:

seventh means coupled to said first means and to said second means for calculating a difference between said first voltage sense signal and said second voltage sense signal, said seventh means producing an actual delta voltage signal thereby;

eighth means senseably coupled to the feeders for sensing current flowing therein, said eighth means producing a connected load signal thereby;

ninth means for comparing said connected load signal with a normal voltage drop versus connected load profile, said ninth means producing an expected delta voltage signal thereby; and tenth means for comparing said actual delta voltage signal against said expected delta voltage signal, said tenth means indicating the source of the harmonic distortion as the utilization equipment when said actual delta voltage signal deviates from said expected delta voltage signal by greater than a predetermined amount.

4. A discrimination circuit for use in an electric power generation system having a source of electric power producing and output voltage waveform, the source having output terminals coupled by feeders to a point of regulation remote from the source and in relative proximity to the load distribution bus having utilization equipment coupled thereto, the output voltage waveform including harmonic distortion, source of which is unknown, the circuit comprising:

first means coupled to the output terminals of the source of electric power for sensing the output voltage waveform present thereon, said first means producing a first voltage sense signal in response thereto;

second means coupled to the point of regulation for sensing the output voltage waveform present thereon, said second means producing a second voltage sense signal in response thereto;

third means responsive to said first and said second voltage sense signals for descrimination a source of any harmonic distortion of the output voltage waveform between the source of electric power and the utilization equipment, and wherein said third means comprises, seventh means coupled to said first means and to said second means for calculating a difference between said first voltage sense signal and said second voltage sense signal, said seventh means producing an actual delta voltage signal thereby, eighth means sensably coupled to the feeders for sensing current flowing therein, said eighth means producing a connected load signal thereby, ninth means for comparing said connected load signal with a normal voltage drop versus connected load profile, said ninth means producing an expected delta voltage signal thereby, and tenth means for comparing said actual delta voltage signal against said expected delta voltage signal, said tenth means indicating the source of the harmonic distortion as the utilization equipment when said actual delta voltage signal deviates from said expected delta voltage signal by greater than a predetermined amount.

5. The circuit of claim 4, wherein said third means further comprises:

fourth means coupled to said first means for calculating a first percentage total harmonic content of said first voltage sense signal representing a percentage total harmonic content present at the output terminals of the source of electric power;

fifth means coupled to said second means for calculating a second percentage total harmonic content of said second voltage sense signal representing a percentage total harmonic content present at the point of regulation; and sixth means coupled to said fourth and said fifth means for comparing said first percentage total harmonic content with said second percentage total harmonic content, said sixth means indicating the source of the harmonic distortion as utilization equipment when said second percentage total harmonic content is greater than said first percentage total harmonic content, said sixth means further indicating the source of the harmonic distortion as the source of electric power when said second percentage total harmonic content is not greater than said first percentage total harmonic content.

6. A system of protection against harmonic distortion for an electric power generation system having a source generating an electric power waveform coupled by feeders to a distribution bus defining a point or regulation remotely located from the source to which utilization equipment is connected, the system of protection comprising:

first means coupled to the source for sensing the electric power waveform, said first means producing a first electric power sense signal thereby;

second means coupled to the point of regulation for sensing the electric power waveform, said second means producing a second electric power sense signal thereby;

9 third means for calculating a first percentage total harmonic content of said first electric power sense signal;

fourth means for monitoring said first percentage total harmonic content against a threshold, said fourth means generating a protective signal when said first percentage total harmonic content exceeds said threshold;

fifth means responsive to said first electric power sense signal and to said second electric power sense signal for discriminating a source of the harmonic distortion between the source of electric power and the utilization equipment; and wherein said fourth means adjusts said threshold when said fifth means discriminates that the source of the harmonic distortion is the utilization equipment.

7. The protection system of claim 6, wherein said fourth means adjusts said threshold to require a greater percentage total harmonic content when said fifth means discriminates the source of harmonic distortion as the utilization equipment.

8. The protection system of claim 6, wherein said fifth means comprises:

sixth means coupled to said second means for calculating a second percentage total harmonic content of said second voltage sense signal representing a percentage total harmonic content present at the point of regulation; and seventh means coupled to said third and said sixth means for comparing said first percentage total harmonic content with said second percentage total harmonic content, said seventh means indicating the source of the harmonic distortion as utilization equipment when said second percentage total harmonic content is greater than said first percentage total harmonic content, said seventh means further indicating the source of the harmonic distortion as the source of electric power when said second percentage total harmonic content is not greater than said first percentage total harmonic content.

9. The protection system of claim 8, wherein said fifth means further comprises:

eighth means coupled to said first means and to said second means for calculating a difference between said first voltage sense signal and said second voltage sense signal, said eighth means producing an actual delta voltage signal thereby;

ninth means senseably coupled to the feeders for sensing current flowing therein, said ninth means producing a connected load signal thereby;

tenth means for comparing said connected load signal with a normal voltage drop versus connected load profile, said tenth means producing an expected delta voltage signal thereby; and eleventh means for comparing said actual delta voltage signal against said expected delta voltage signal, said eleventh means indicating the source of the harmonic distortion as the utilization equipment when said actual delta voltage signal deviates from said expected delta voltage signal by greater than a predetermined amount.

10. The protection system of claim 6, wherein said fifth means comprises:

eighth means coupled to said first means and to said second means for calculating a difference between said first voltage sense signal and said second voltage sense signal, said eighth means producing an actual delta voltage signal thereby;

10 ninth means senseably coupled to the feeders for sensing current flowing therein, said ninth means producing a connected load signal thereby;

tenth means for comparing said connected load signal with a normal voltage drop versus connected load profile, said tenth means producing an expected delta voltage signal thereby; and eleventh means for comparing said actual delta voltage signal against said expected delta voltage signal, said eleventh means indicating the source of the harmonic distortion as the utilization equipment when said actual delta voltage signal deviates from said expected delta voltage signal by greater than a predetermined amount.

11. The protection system of claim 10, wherein said fifth means further comprises:

sixth means coupled to said second means for calculating a second percentage total harmonic content of said second voltage sense signal representing a percentage total harmonic content present at the point of regulation; and seventh means coupled to said third and said sixth means for comparing said first percentage total harmonic content with said second percentage total harmonic content, said seventh means indicating the source of the harmonic distortion as utilization equipment when said second percentage total harmonic content is greater than said first percentage total harmonic content, said seventh means further indicating the source of the harmonic distortion as the source of electric power when said second percentage total harmonic content is not greater than said first percentage total harmonic content.

12. A method of discriminating the source of harmonic distortion in an electric power generation system having a source of electric power producing an output voltage waveform, the source having output terminals coupled by feeders to a point of regulation remote from the source and in relative proximity to a load distribution bus having utilization equipment coupled thereto, the method comprising the steps of:

sensing the output voltage waveform present at the output terminals of the source of electric power;

sensing the output voltage waveform present at the point of regulation;

calculating a first percentage total harmonic content of the voltage waveform present at the output terminals of the source of electric power;

calculating a second percentage total harmonic content of the voltage waveform present at the point of regulation; and comparing said first percentage total harmonic content with said second percentage total harmonic content, said comparing step indicating the source of the harmonic distortion as the utilization equipment when said second percentage total harmonic content is greater than said first percentage total harmonic content, said comparing step further indicating the source of the harmonic distortion as the source of electric power when said second percentage total harmonic content is not greater than said first percentage total harmonic content.

13. The method of claim 12, further comprising the steps of:

calculating a difference between the output voltage waveform present at the output terminals of the source of electric power and the output voltage waveform present at the point of regulation to produce an actual delta voltage signal;

sensing current flowing in the feeders to produce a connected load signal;

comparing said connected load signal with a profile of a normal voltage drop versus connected load to produce an expected delta voltage signal; and comparing said actual delta voltage signal against said expected delta voltage signal, this comparing step indicating the source of the harmonic distortion as the utilization equipment when said actual delta voltage signal deviates from said expected delta voltage signal by greater than a predetermined amount.

14. A method of discriminating the source of harmonic distortion in an electric power generation system having a source of electric power producing an output voltage waveform, the source having output terminals coupled by feeders to a point of regulation remote from the source and in relative proximity to a load distribution bus having utilization equipment coupled thereto, the method comprising the steps of:

sensing the output voltage waveform present at the output terminals of the source of electric power;

sensing the output voltage waveform present at the point of regulation;

calculating a difference between the output voltage waveform present at the output terminals of the source of electric power and the output voltage waveform present at the point of regulation to produce an actual delta voltage signal;

sensing current flowing in the feeders to produce a connected load signal;

comparing said connected load signal with a profile of a normal voltage drop versus connected load to produce an expected delta voltage signal; and comparing said actual delta voltage signal against said expected delta voltage signal, this comparing step indicating the source of the harmonic distortion as the utilization equipment when said actual delta voltage signal deviates from said expected delta voltage signal by greater than a predetermined amount.

15. The method of claim 14, further comprising the steps of:

calculating a first percentage total harmonic content of the voltage waveform present at the output terminals of the source of electric power;

calculating a second percentage total harmonic content of the voltage waveform present at the point of regulation; and comparing said first percentage total harmonic content with said second percentage total harmonic content, said comparing step indicating the source of the harmonic distortion as the utilization equipment when said second percentage total harmonic content is greater than said first percentage total harmonic content, said comparing step further indicating the source of the harmonic distortion as the source of electric power when said second percentage total harmonic content is not greater than said first percentage total harmonic content.

* * * * *